(12) United States Patent
Lamansky et al.

(10) Patent No.: US 8,538,224 B2
(45) Date of Patent: Sep. 17, 2013

(54) OLED LIGHT EXTRACTION FILMS HAVING INTERNAL NANOSTRUCTURES AND EXTERNAL MICROSTRUCTURES

(75) Inventors: Sergey A. Lamansky, Apple Valley, MN (US); Terry L. Smith, Roseville, MN (US); Jun-Ying Zhang, Woodbury, MN (US); Leslie A. Todero, West Saint Paul, MN (US); Encai Hao, Woodbury, MN (US); Ha T. Le, Saint Paul, MN (US); Ding Wang, Austin, TX (US); Fei Lu, Woodbuty, MN (US); Shoichi Masuda, Tokyo (JP)

(73) Assignee: 3M Innovative Properties Company, Saint Paul, MN (US)

( * ) Notice: Subject to any disclaimer, the term of this patent is extended or adjusted under 35 U.S.C. 154(b) by 240 days.

(21) Appl. No.: 12/765,014

(22) Filed: Apr. 22, 2010

(65) Prior Publication Data

US 2011/0262093 A1    Oct. 27, 2011

(51) Int. Cl.
*G02B 6/10* (2006.01)
*H01J 1/62* (2006.01)

(52) U.S. Cl.
USPC .......................................... 385/131; 313/494

(58) Field of Classification Search
USPC ....................................................... 385/131
See application file for complete search history.

(56) References Cited

U.S. PATENT DOCUMENTS

| 5,011,642 A | 4/1991 | Welygan et al. |
| 5,175,030 A | 12/1992 | Lu et al. |
| 5,183,597 A | 2/1993 | Lu |
| 5,396,350 A * | 3/1995 | Beeson et al. .................. 349/62 |
| 6,285,001 B1 | 9/2001 | Fleming et al. |
| 6,630,684 B2 | 10/2003 | Lee et al. |
| 6,831,302 B2 | 12/2004 | Erchak et al. |
| 7,018,713 B2 | 3/2006 | Padiyath et al. |
| 7,078,735 B2 | 7/2006 | Shono et al. |
| 7,165,959 B2 | 1/2007 | Humlicek et al. |
| 7,211,831 B2 | 5/2007 | Erchak et al. |
| 7,358,543 B2 | 4/2008 | Chua et al. |
| 7,473,932 B2 | 1/2009 | Cho et al. |
| 2003/0057417 A1 | 3/2003 | Lee et al. |
| 2004/0206971 A1 | 10/2004 | Erchak et al. |
| 2004/0206972 A1 | 10/2004 | Erchak et al. |
| 2004/0217702 A1 | 11/2004 | Garner et al. |
| 2005/0116625 A1 | 6/2005 | Park et al. |
| 2005/0173714 A1 | 8/2005 | Lee et al. |
| 2006/0027815 A1 | 2/2006 | Wierer, Jr. et al. |
| 2006/0062540 A1 | 3/2006 | Zoorob et al. |
| 2006/0071233 A1 | 4/2006 | Cho et al. |
| 2006/0114365 A1* | 6/2006 | Takahashi ...................... 349/57 |

(Continued)

FOREIGN PATENT DOCUMENTS

| CN | 1622727 | 6/2005 |
| CN | 1758819 | 4/2006 |

(Continued)

*Primary Examiner* — Uyen Chau N Le
*Assistant Examiner* — Chris Chu

(57) ABSTRACT

A light extraction film having internal nanostructures and external microstructures for organic light emitting diode (OLED) devices. The light extraction film includes a flexible substantially transparent film, a low index nanostructured layer applied to the film, and a high index planarizing backfill layer applied over the nanostructured layer. External optical microstructures are applied to the flexible substantially transparent film on a side opposite the nanostructured layer to enhance light extraction from the OLED devices while providing for a more uniform luminance distribution.

13 Claims, 1 Drawing Sheet

(56) References Cited

U.S. PATENT DOCUMENTS

| | | |
|---|---|---|
| 2006/0192225 A1 | 8/2006 | Chua et al. |
| 2006/0237739 A1 | 10/2006 | Shono et al. |
| 2006/0267029 A1 | 11/2006 | Li |
| 2006/0270081 A1 | 11/2006 | Chua et al. |
| 2007/0221907 A1 | 9/2007 | Jang et al. |
| 2007/0241326 A1 | 10/2007 | Kim et al. |
| 2007/0257269 A1 | 11/2007 | Cho et al. |
| 2008/0042546 A1 | 2/2008 | Huang et al. |
| 2008/0130122 A1 | 6/2008 | Egi et al. |
| 2008/0135866 A1 | 6/2008 | Donofrio |
| 2008/0165315 A1 | 7/2008 | Nishida et al. |
| 2008/0284320 A1 | 11/2008 | Karkkainen |
| 2009/0015142 A1* | 1/2009 | Potts et al. .................... 313/504 |
| 2009/0067962 A1 | 3/2009 | Lee |
| 2009/0120416 A1 | 5/2009 | Wey |
| 2010/0128351 A1* | 5/2010 | Epstein et al. ................ 359/613 |

FOREIGN PATENT DOCUMENTS

| | | |
|---|---|---|
| CN | 1828952 | 9/2006 |
| CN | 101000949 | 7/2007 |
| CN | 101027782 | 8/2007 |
| CN | 101409331 | 4/2009 |
| DE | 10 2005 050 317 | 8/2006 |
| EP | 1 624 499 A2 | 2/2006 |
| EP | 1 691 429 A2 | 8/2006 |
| JP | 2003-109749 | 4/2003 |
| JP | 2005-166635 | 6/2005 |
| JP | 2005-251489 | 9/2005 |
| JP | 2006-54473 | 2/2006 |
| JP | 2006-108093 | 4/2006 |
| JP | 2006-222082 | 8/2006 |
| JP | 2006-245580 | 9/2006 |
| JP | 2006-332682 | 12/2006 |
| JP | 2007-525817 | 9/2007 |
| JP | 2007-258113 | 10/2007 |
| JP | 2007-258700 | 10/2007 |
| JP | 2008-513988 | 5/2008 |
| KR | 2003-0026450 | 4/2003 |
| KR | 2005-0025919 | 3/2005 |
| KR | 2005-0052648 | 3/2005 |
| KR | 2006-0030396 | 4/2006 |
| KR | 2006-0043606 | 5/2006 |
| KR | 10-0615257 | 8/2006 |
| KR | 2007-0103280 | 10/2007 |
| KR | 10-892957 | 3/2009 |
| WO | WO 2004/093143 | 10/2004 |
| WO | WO 2006/032865 | 3/2006 |
| WO | WO 2006/134218 | 12/2006 |
| WO | WO 2007/055468 | 5/2007 |
| WO | WO 2009/009695 | 1/2009 |
| WO | WO 2009/011961 | 1/2009 |
| WO | WO 2009/067308 | 5/2009 |
| WO | WO 2009/067552 | 5/2009 |

* cited by examiner

OLED LIGHT EXTRACTION FILMS HAVING INTERNAL NANOSTRUCTURES AND EXTERNAL MICROSTRUCTURES

BACKGROUND

Organic Light Emitting Diode (OLED) devices include a thin film of electroluminescent organic material sandwiched between a cathode and an anode, with one or both of these electrodes being a transparent conductor. When a voltage is applied across the device, electrons and holes are injected from their respective electrodes and recombine in the electroluminescent organic material through the intermediate formation of emissive excitons.

In OLED devices, over 70% of the generated light is typically lost due to processes within the device structure. The trapping of light at the interfaces between the higher index organic and Indium Tin Oxide (ITO) layers and the lower index substrate layers is the major cause of this poor extraction efficiency. Only a relatively small amount of the emitted light emerges through the transparent electrode as "useful" light. The majority of the light undergoes internal reflections, which result in its being emitted from the edge of the device or trapped within the device and eventually being lost to absorption within the device after making repeated passes.

Light extraction films use internal nanostructures to avoid waveguiding losses within the device. While providing strong light extraction, internal nanostructures, comprising regular features such as photonic crystals or linear gratings, tend to produce pattern-wise luminance and color distribution, which may not be desirable in final applications. Thus, a need exists for a light extraction film to both efficiently enhance light through the nanostructures while also reducing luminance and color angular non-uniformity in the light output.

SUMMARY

A light extraction film, consistent with the present invention, includes a flexible substantially transparent film, a low index nanostructured layer applied to the flexible substantially transparent film, and a high index planarizing backfill layer applied over the nanostructured layer. External optical microstructures are applied to the flexible substantially transparent film on a side opposite the nanostructured layer.

A method for making a light extraction film, consistent with the present invention, includes providing a flexible substantially transparent film, applying a low index nanostructured layer to the flexible substantially transparent film, and applying a high index planarizing backfill layer over the nanostructured layer. The method also includes applying external optical microstructures to the flexible substantially transparent film on a side opposite the nanostructured layer.

The combination of internal nanostructures and external microstructures provides for enhanced light extraction with a more uniform luminance distribution.

BRIEF DESCRIPTION OF THE DRAWINGS

The accompanying drawings are incorporated in and constitute a part of this specification and, together with the description, explain the advantages and principles of the invention. In the drawings.

DETAILED DESCRIPTION

Embodiments of the present invention relate to light extraction films and uses of them for OLED devices. Examples of light extraction films are described in U.S. Patent Applications Publication Nos. 2009/001575 and 2009/0015142, both of which are incorporated herein by reference as if fully set forth.

Figure 1:
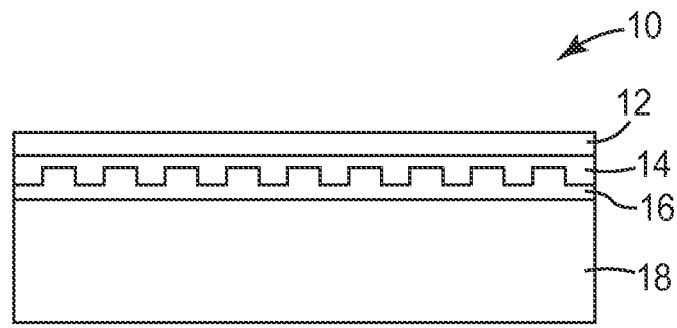
FIG. 1 is a diagram of a light extraction film having nanostructures.

FIG. 1 is a diagram of the construction of a light extraction film 10 having nanostructures. Light extraction film 10 includes a flexible substantially transparent film substrate 18, a low index nanostructured layer 16, a high index planarizing backfill layer 14, and an optional protective layer 12. The nanostructured layer 16 includes nanostructures, meaning a structure having at least one dimension less than 2 microns and preferably less than 1 micron. The nanostructured layer can have a periodic, quasi-periodic, or random distribution or pattern of optical nanostructures, including photonic crystal structures or linear gratings. The term photonic crystal structures refers to periodic or quasi-periodic optical nanostructures interspersed with a material of sufficiently different index of refraction that will enable the structure to produce gaps in the spectrum of allowed electromagnetic modes in the material.

The nanostructures can be one-dimensional, meaning they have at least one dimension, such as width, less than 2 microns. One-dimensional nanostructures include, for example, continuous or elongated prisms or ridges. The nanostructures can also be two-dimensional, meaning they have at least two dimensions, for example two in-plane directions, less than 2 microns. Two-dimensional nanostructures include, for example, round or square shaped posts.

Planarizing backfill layer 14 is applied over nanostructured layer 16 to planarize it and provide for index contrast. Low index nanostructure layer 16 with high index backfill layer 14 means that backfill layer 14 has a higher index of refraction than nanostructured layer 16 and that backfill layer 14 and nanostructured layer 16 have a sufficient difference in refractive indices to enhance light extraction of an OLED device in optical communication with light extraction film 10. Low index nanostructured layer 16 typically has an index of refraction in the range of 1.4-1.6, although different ranges can be used. Examples of high index backfill layers for light extraction films are described in U.S. patent application Ser. No. 12/262,393 and filed Oct. 31, 2008, which is incorporated herein by reference as if fully set forth.

Figure 2:
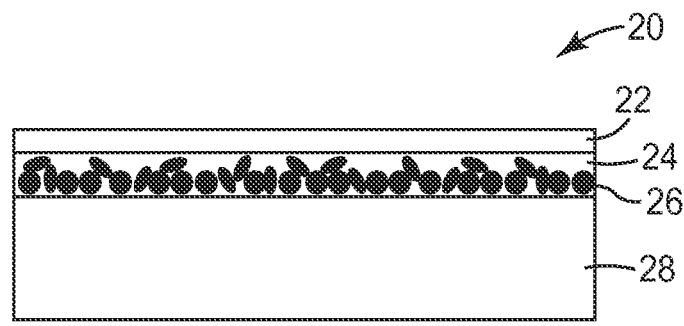
FIG. 2 is a diagram of a light extraction film having nanoparticles.

FIG. 2 is a diagram of a light extraction film 20 having nanoparticles. Light extraction film 20 includes a flexible substantially transparent film substrate 28, a low index nanostructured layer 26, a high index planarizing backfill layer 24, and an optional protective layer 22. The nanostructured layer 26 includes nanoparticles, meaning particles having at least one dimension less than 2 microns and preferably less than 1 micron. The nanoparticles can be composed of organic materials or other materials, and they can have any particle shape, regular or irregular. The nanoparticles can alternatively be implemented with porous particles. The distribution of nanostructures can also have varying pitches and feature size. At least a portion of the nanoparticles are preferably in contact with the flexible substrate, and the nanoparticles may have voids beneath them. The layer of nanoparticles can be implemented with nanoparticles in a monolayer, with a layer having agglomerations of nanoparticles, or in a multi-layer. The nanoparticles can be coated without use of a binder, which can result in the agglomerations of nanoparticles. Furthermore, the nanoparticles are preferably coated or otherwise applied in a surface layer manner to the flexible substrate. Examples of nanoparticles used in light extraction films are described in U.S. patent application Ser. No. 12/336,889 and filed Dec. 17, 2008, which is incorporated herein by reference as if fully set forth.

Planarizing backfill layer 24 is applied over nanostructured layer 26 to planarize it and provide for index contrast. Low index nanostructure layer 26 with high index backfill layer 24 means that backfill layer 24 has a higher index of refraction than the nanoparticles in nanostructured layer 26 and that backfill layer 24 and the nanoparticles in nanostructured layer 26 have a sufficient difference in refractive indices to enhance light extraction of an OLED device in optical communication with light extraction film 20.

Materials for the substrates, low index layers, high index layers, and optional protective layers for light extraction films 10 and 20 are provided in the published patent applications identified above. Processes for making light extraction films 10 and 20 are also provided in the published patent applications identified above.

Figure 3:
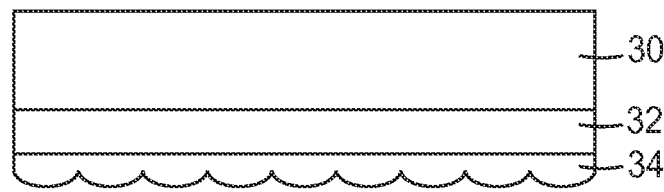
FIG. 3 is a diagram of an OLED device with a light extraction film having external microstructures.

FIG. 3 is a diagram of an OLED device 30 with a light extraction film 32 having external microstructures 34 to enhance the light extraction from OLED device 30. Light extraction film 32 can be implemented with, for example, light extraction films 10 and 20 described above or other films for enhancing light extraction from OLED devices. The microstructures are applied to or located on a side of the flexible film substrate, such as films 18 and 28, opposite the nanostructured layer. In particular, the external optical microstructures can be on a separate film applied to the flexible film substrate, or the microstructures can be microreplicated on the film substrate.

The term microstructures refers to a structure having at least one dimension less than 1 millimeter and greater than 1 micron. The microstructures can have a periodic, quasi-periodic, or random distribution or pattern. The microstructures can be one-dimensional, meaning they have at least one dimension, such as width, between 1 micron and 1 millimeter. One-dimensional microstructures include, for example, continuous or elongated prisms or lenses. The microstructures can also be two-dimensional, meaning they have at least two dimensions, for example two in-plane directions, between 1 micron and 1 millimeter. Two-dimensional microstructures include, for example, lenslets. Other examples of two-dimensional optical microstructures are curve sided cone structures as described in U.S. patent application Ser. No. 12/275,631 and filed Nov. 21, 2008, which is incorporated herein by reference as if fully set forth. If one-dimensional external microstructures are used with one-dimensional internal nanostructures, such as nanostructures 16, the microstructures are preferably orthogonal to the nanostructures. For example, the film can contain internal linear nanostructures orthogonal to external linear microstructures. Other useful external microstructures include two-dimensional high aspect ratio microreplicated diffusers and volume diffusers based upon a highly scattering ultra-low index material. The nanostructures and microstructures can each comprise the same type of structures, or they can be combinations of different types of structures.

Light extraction film 32 can be made using a variety of methods such as the following. A film having the internal nanostructures can be laminated to a film having the external microstructures. Sequential microreplication processes can be used to form the internal nanostructures and the external microstructures in multiple processes using a first tool to create the nanostructures in the film and a second tool to create the microstructures in the film. An example of a microreplication process to make an optical film is described in U.S. Pat. Nos. 5,175,030 and 5,183,597, both of which are incorporated herein by reference as if fully set forth. A process using two structured and synchronized tools can be used to create the nanostructures and microstructures in the film in a single process. An apparatus and process to structure a film on two sides using two structured and synchronized tools is described in U.S. Pat. No. 7,165,959, which is incorporated herein by reference as if fully set forth. An extrusion process can be used to create the internal nanostructures and external microstructures, possibly using multiple structured extrusion rollers in a single process. Examples of extrusion processes are described in U.S. Patent Application Ser. No. 61/148,235, filed Jan. 29, 2009, and U.S. Pat. No. 5,011,642, both of which are incorporated herein by reference as if fully set forth. The internal nanostructures and external microstructures can be created in separate processes using laser ablation, such as the laser ablation process as described in U.S. Pat. No. 6,285,001, which is incorporated herein by reference as if fully set forth. The nanostructures and microstructures can also be formed in the film using a process to make microlens arrays as described in PCT Patent Applications Publication Nos. WO 2009/67308 and WO 2009/67442, both of which are incorporated herein by reference as if fully set forth.

EXAMPLES

All parts, percentages, ratios, etc. in the Examples are by weight, unless noted otherwise. Solvents and other reagents used were obtained from Sigma-Aldrich Chemical Company; Milwaukee, Wis. unless indicated unless specified differently.

Materials

Accentrim is a UV curable resin blend obtained from 3M Company, St. Paul, Minn. Alq is 8-hydroxyquinolino aluminum and is available from Sensient Imaging Technologies GmbH, Germany.

BEF2 is a brightness enhancement film available from 3M Company, St. Paul, Minn.

BEF3 is a brightness enhancement film available from 3M Company, St. Paul, Minn.

BS702 is a beaded gain diffuser film obtained from Kewia Inc., Osaka, Japan.

GG12 is a gain diffuser made according to U.S. patent application Ser. No. 12/275,631.

GD908 is a gain diffuser made according to Japanese Patent Application No. 2009-120416.

LGD is a microreplicated linear gain diffuser.

Smart Gel OC-431A is an optically matching fluid with a refractive index of 1.46 available from Nye Lubricants, Fairhaven, Mass.

Reference OLED Fabrication on 2D Photonic Crystal Nanostructured Film for Examples 1-9

A 500 nm-pitch 2D photonic crystal (PhC) nanostructured film on PET was prepared via continuous cast and cure (3C) replication from nanostructured tools fabricated by interference lithography followed by planarizing high refractive index backfill coating and curing as described in U.S. patent application Ser. No. 12/262,393, identified above. Indium tin oxide (ITO) anode was coated onto the backfilled nanostructured film via radio-frequency sputtering in low-vacuum argon/oxygen atmosphere resulting in an approximately 120 nm-thick film with resistivity in 30-40Ω/□ range and optical transmittance in mid- to high-80% across the visible spectrum. In order to reduce moisture content in the PET substrate films, the ITO-coated films were annealed at 80° C. for approximately 16 hours under inert atmosphere.

Immediately prior to OLED device fabrication, ITO-coated nanostructured film substrates were pre-cleaned with a standard oxygen plasma cleaning routine.

The following bottom-emissive OLED construction was fabricated at standard base vacuum of $10^{-6}$ torr using different layout shadow masks for organic and cathode layer depositions: HIL(300 nm)/HTL(40 nm)/EML(30 nm)/Alq(20 nm)/LiF(1 nm)/Al(200 nm), where HIL is a hole-injection layer, HTL is a hole-transport layer, EML is an emissive layer with green electroluminescence characteristics, and Alq is an electron transport layer.

The devices were encapsulated by laminating a barrier encapsulation film as described in U.S. Pat. No. 7,018,713 (Padiyath et al.) under inert atmosphere using SAES moisture and oxygen scavenging getters (available from SAES Getters USA, Inc., Colorado Springs, Colo.).

Examples 1-9

In order to mimic the performance of the light extraction film with both internal nanostructure and external microstructure extractors, the finished OLED devices built on 2D nanostructured light extraction films were used as references for the evaluation of various external diffuser films. A series of external diffusers were laminated onto three of the reference OLED devices built on 2D PhC nanostructured film (labeled Ref. 1, Ref. 2, and Ref. 3) using Smart Gel OC-431A.

Angular luminance performance of the devices was studied using two approaches: (1) goniometry using a Photo Research PR650 photometric camera (available from Photo Research, Inc., Chatsworth, Calif.) set up with a manual rotational goniometer; and (2) conoscopy using an Autronic conoscope (available from Autronic-Melchers GmbH, Karlsruhe, Germany). The devices were driven at a fixed current density of about 10 mA/cm$^2$ for both goniometric and conoscopic measurements. The results are shown in Table 1.

TABLE 1

| Example Number | External Diffuser | On-axis luminance ratio | Integrated luminance ratio | Uniformity of Conoscopic image |
|---|---|---|---|---|
| 1 (Comparative) | None (Ref. 1) | 1.00 | 1.00 | Very non-uniform |
| 2 | Ref. 1 + BEF2 | 0.75 | 0.90-0.95 | Very non-uniform |
| 3 | Ref. 1 + BEF3 | 0.78 | 0.95-1.00 | Non-uniform |
| 4 | Ref. 1 + LGD | 0.80 | 0.95-1.00 | Non-uniform |
| 5 | Ref. 1 + BS702 | 0.80 | 0.95-1.05 | Uniform |
| 6 (Comparative) | None (Ref. 2) | 1.00 | 1.00 | Very non-uniform |
| 7 | Ref. 2 + GD12 | 0.65 | 0.95-1.05 | Uniform |
| 8 (Comparative) | None (Ref. 3) | 1.00 | 1.00 | Very non-uniform |
| 9 | Ref. 3 + GD908 | 0.80-0.85 | 0.95-1.05 | Uniform |

Examples 10-14

A 600 nm-pitch 1D grating nanostructured film on PET was prepared via 3C replication from nanostructured tools fabricated by focused ion beam milled diamond turning tooling followed by planarizing high refractive index backfill coating and curing as described in U.S. patent application Ser. No. 12/262,393. The consequent steps of ITO anode sputtering, OLED deposition, encapsulation and evaluation were conducted as described for Examples 1-9.

A series of linear external diffusers described below was laminated onto the devices built on 1D PhC nanostructured film using Smart Gel OC-431A optically matching fluid with refractive index of 1.46.

The LGD microreplicated gain diffusers used in these examples have linear replicated featured oriented both parallel (II) and perpendicular (I) to the orientation of submicron linear features in the 1D PhC nanostructured film.

TABLE 2

| Example | Film | On-axis luminance ratio | Integrated luminance ratio | Uniformity of Conoscopic image |
|---|---|---|---|---|
| 10 (Comparative) | None (Reference) | 1.00 | 1.00 | Non-uniform |
| 11 | Reference + LGD (II) | 0.90 | 0.80-0.85 | Very non-uniform |
| 12 | Reference + LGD (⊥) | 1.20 | 0.90-0.95 | Uniform |
| 13 | Reference + BS702 | 1.00 | 0.85-0.90 | Uniform |
| 14 | Reference + GD12 | 1.30-1.35 | 1.00-1.05 | Uniform |

Example 15

In this example, a light extraction film with both internal two dimensional photonic crystal (PhC) nanostructure and external microstructure was made by forming a PhC structure on the back side of a film that already had a microstructure on one side. GD12 gain diffuser film has a primer on only one side and the microstructure is on this primed side. In this Example, a photonic crystal structure was formed on the back side (the side opposite the microstructure) of a GD12 film.

In order to successfully replicate onto the back side of the unprimed GD12 film, a priming step was performed prior to the replication step. Graft priming was completed by applying a thin layer of Hexanediol diacrylate with 3% benzophenone to the back side of the GD12 film. This thin layer was applied by placing a drop of the material on the back side of the film and then using a KimWipe (available from Kimberly-Clark Corporation, Irving, Tex.) to spread a thin layer of the material across the area of the film. The coated film was then UV cured on a belt line UV processor with the following conditions: Fusion D bulb; 100% power; Dichroic reflector; and 15 cm/second (30 feet per minute) line speed.

A flexible polymer tool as described in PCT Patent Application No. US 2009/067962 was used that had a structure having a pitch of 500 nm and depths of 220-230 nm. The polymer tool was placed on a hot plate set at 57.2° C. (135° F.) with the structured tool side face up. A drop of Accentrim resin was placed at the top edge of the tool, and then the primed back side of the GD12 film was brought into contact with the Accentrim resin and the tool. A small handheld roller was used to apply pressure to the top side (structured side) of the GD12 film and to more evenly distribute the Accentrim resin across the area of the tool. This "sandwich" of DG12 film, resin, and polymer tool was then UV cured on a belt line UV processor with the following conditions: Fusion D bulb; 100% power; Dichroic reflector; and 15 cm/second (30 feet per minute) line speed. Once the curing was completed and the film "sandwich" cooled for about five seconds, the polymer tool and the GD12 film were separated by pulling them apart. The cured replicated resin remained on the back side of the GD12 film.

An AFM study of the typical 2D PhC replicated area indicated that the replication was conducted with a good fidelity with structural characteristics of the resulting 2D PhC very similar to the same structure replicated on other films.

The invention claimed is:

1. A light extraction film having internal nanostructures and external microstructures, comprising:
    a flexible substantially transparent film having a major surface and in-plane directions parallel with the major surface;
    a low index nanostructured layer applied to the flexible substantially transparent film and having nanostructures;
    a high index planarizing backfill layer applied over the nanostructured layer; and
    external optical microstructures applied to the flexible substantially transparent film on a side opposite the nanostructured layer,
    wherein the nanostructures consist of one-dimensional nanostructures extending substantially parallel with the in-plane directions along a first single direction and the external optical microstructures consist of one-dimensional microstructures extending substantially parallel with the in-plane directions along a second single direction, and the first single direction is different from the second single direction.

2. The light extraction film of claim 1, wherein the one-dimensional microstructures are orthogonal to the one-dimensional nanostructures in the in-plane directions.

3. The light extraction film of claim 2, wherein the one-dimensional nanostructures and the one-dimensional microstructures are each linear structures.

4. The light extraction film of claim 1, wherein the low index nanostructured layer comprises photonic crystal structures or linear gratings.

5. The light extraction film of claim 1, further comprising a protective layer applied over the backfill layer.

6. A method for making a light extraction film having internal nanostructures and external microstructures, comprising:
    providing a flexible substantially transparent film having a major surface and in-plane directions parallel with the major surface;
    applying a low index nanostructured layer having nanostructures to the flexible substantially transparent film;
    applying a high index planarizing backfill layer over the nanostructured layer; and
    applying external optical microstructures to the flexible substantially transparent film on a side opposite the nanostructured layer,
    wherein the nanostructures consist of one-dimensional nanostructures extending substantially parallel with the in-plane directions along a first single direction and the external optical microstructures consist of one-dimensional microstructures extending substantially parallel with the in-plane directions along a second single direction, and the first single direction is different from the second single direction.

7. The method of claim 6, wherein the one-dimensional microstructures are orthogonal to the one-dimensional nanostructures in the in-plane directions.

8. The method of claim 6, further comprising applying a protective layer over the backfill layer.

9. The method of claim 6, wherein the nanostructured layer and the external optical microstructures are contained within two films laminated together.

10. The method of claim 6, wherein the nanostructured layer and the external optical microstructures are formed using sequential microreplication processes.

11. The method of claim 6, wherein the nanostructured layer and the external optical microstructures are formed in a single microreplication process using two structured and synchronized tools.

12. The method of claim 6, wherein the nanostructured layer and the external optical microstructures are formed using an extrusion process.

13. The method of claim 6, wherein the nanostructured layer and the external optical microstructures are each formed using a laser ablation process.

* * * * *